(12) United States Patent
Kim

(10) Patent No.: US 12,271,618 B2
(45) Date of Patent: Apr. 8, 2025

(54) IDENTIFYING CENTER OF VALLEY IN MEMORY SYSTEMS

(71) Applicant: Micron Technology, Inc., Boise, ID (US)

(72) Inventor: Kyungjin Kim, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 17/972,174

(22) Filed: Oct. 24, 2022

(65) Prior Publication Data

US 2024/0134559 A1   Apr. 25, 2024
US 2024/0231673 A9   Jul. 11, 2024

(51) Int. Cl.
*G06F 3/06* (2006.01)

(52) U.S. Cl.
CPC .......... *G06F 3/0653* (2013.01); *G06F 3/0619* (2013.01); *G06F 3/0679* (2013.01)

(58) Field of Classification Search
CPC .... G06F 3/0653; G06F 3/0619; G06F 3/0679; G11C 29/021; G11C 29/028; G11C 2029/0411
See application file for complete search history.

(56) References Cited

U.S. PATENT DOCUMENTS

| 5,619,452 A * | 4/1997 | Miyauchi | G06F 3/0601 |
| | | | 365/185.11 |
| 2022/0180957 A1* | 6/2022 | Yang | G11C 7/106 |

* cited by examiner

*Primary Examiner* — Hiep T Nguyen
(74) *Attorney, Agent, or Firm* — Schwegman Lundberg & Woessner, P.A.

(57) ABSTRACT

Aspects of the present disclosure configure a system component, such as a memory sub-system controller, to identify a center of valley (CoV) of a set of read levels. The controller detects a read error associated with reading data from the set of memory components in accordance with an individual read level of a plurality of read levels and, in response to detecting the read error, generates a plurality of bins as a function of a plurality of check failure bit count values and one or more error count values corresponding to a set of read levels adjacent to the individual read level. The controller computes the CoV for the individual read level based on a pair of read levels defined by a set of the plurality of bins and updates a read level used to read the data based on the computed CoV.

20 Claims, 8 Drawing Sheets

IDENTIFYING CENTER OF VALLEY IN MEMORY SYSTEMS

TECHNICAL FIELD

Embodiments of the disclosure relate generally to memory sub-systems and more specifically to correcting read levels in a memory sub-system based on a corresponding center of valley (CoV).

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
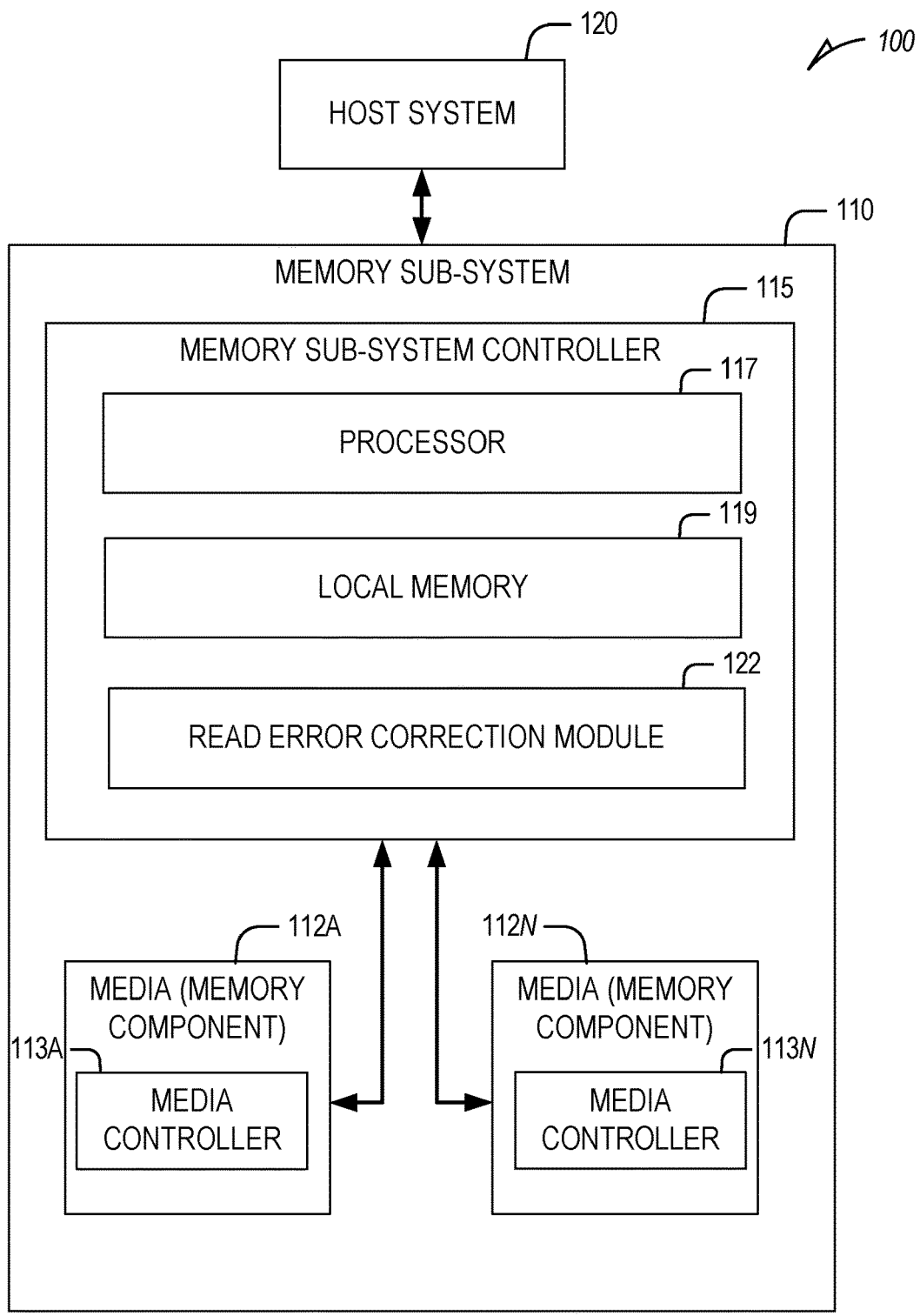
FIG. 1 is a block diagram illustrating an example computing environment including a memory sub-system, in accordance with some embodiments of the present disclosure.

Aspects of the present disclosure configure a system component, such as a memory sub-system controller, to correct a read level used to read data from one or more bit lines of one or more memory components. Data can be read from memory components using different read bias levels or read levels. The disclosed controller can detect an error in the data read at an individual read level and can correct the read level based on a set of conditions. Specifically, the controller generates a plurality of bins representing differences between CFBits (CFBit values) obtained at each of a different one of a set of adjacent read levels. The controller determines that the bins satisfy a bin criterion (e.g., that a first bin is greater than an adjacent second bin which is smaller than the adjacent third bin, such that a second bin between two adjacent bins stores a smaller difference than the two adjacent bins). The controller also ensures that the bin criterion is not erroneously satisfied based on a local minimum in the CFBits associated with an individual read level by examining data parity information associated with the set of adjacent read levels. After verifying that the bin criterion is satisfied and is not a local minimum, such as after performing one or more adjustments to the read level, the controller identifies the corresponding CoV and outputs the associated read levels that define the CoV.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data".

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more dice. Each die can comprise one or more planes. Each LBA of the memory device comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

Conventional memory sub-systems can employ error-correction techniques that involve a decoding process. Such decoding processes can include application of a Low Density Parity Check (LDPC) error code check (ECC) engine to data read from the memory device. The parameters of the LDPC ECC engine can be adjusted to perform more or less complex decoding operations, such as those that utilize hard bit decoding and/or those that utilize soft-bit decoding operations. By performing such error-correction techniques, if a data member of the collection is lost (e.g., corrupted) for any reason, the LDPC ECC engine can be applied to recreate the lost data.

In some cases, data can still not be completely recovered even after performing various error correction processes. For example, data can be stored and represented in the memory sub-system at different read levels. Specifically, in a TLC memory device, data can be stored in one of eight different read levels of the memory sub-system. Charges stored at the different read levels can be read and interpreted into a set of three bits. Ideally, the data is read by applying a read level within a CoV which defines a range of voltage levels that can be applied to accurately read the data from an individual one of the eight different read levels.

In certain situations, the charges stored at one of the read levels can be lost or shift around, which results in inaccuracies when read at the predetermined read level or even within a previously computed CoV. In these circumstances, as part of correcting the read errors that are encountered, the read level or CoV used to read the data may need to be adjusted. One way to adjust the read level may involve preforming reads at adjacent read levels that are offset from the predetermined read level by predefined voltage thresholds. Errors in the data can be computed at each of the adjacent read levels to determine the read level associated with the smallest amount of errors in the read data. For example, if data errors between a first pair of adjacent read levels are smaller than data errors associated with a second pair of adjacent read levels, the controller may use the read level that is in the range defined by the first pair rather than the second pair to attempt to correctly read data from the memory sub-system. While this approach generally works well, the range of read levels obtained based on the difference in error values (e.g., the range defined by the first pair of read levels) is usually far too large to provide adequate and accurate read levels. This results in poor data recovery and failure to recover data in performing error correction.

Aspects of the present disclosure address the above and other deficiencies by configuring a system component, such as a memory sub-system controller of a memory sub-system, to determine a correction to an individual read level defined by a CoV used to read data from a set of memory components based on a combination of multiple criteria or factors. Specifically, the controller uses CFBits read from a plurality of adjacent read levels to identify a range of read levels associated with one of the bins. The controller determines whether the relative CFBit values represented by each bin satisfy a bin criterion as a first factor. The controller also verifies that the bins generated based on the range of read levels satisfy an error criterion to ensure that the bin criterion is not representative of a local minimum as a second factor. After verifying that the bin criterion is satisfied and is not a local minimum, such as after performing one or more adjustments to the read level, the controller identifies the corresponding CoV (or its corresponding adjustments) and outputs the associated read levels that define the CoV.

For instance, in some embodiments the memory sub-system controller detects a read error associated with reading data from the set of memory components in accordance with an individual read level of a plurality of read levels. In response to detecting the read error, the memory sub-system controller generates a plurality of bins as a function of a plurality of CFBit count values and one or more error count values corresponding to a set of read levels adjacent to the individual read level. The memory sub-system controller computes a CoV for the individual read level based on a pair of read levels defined by a set of the plurality of bins and updates a read level used to read the data based on the computed CoV.

In some aspects, the memory sub-system controller obtains a first of the CFBit count values associated with a first read level of the set of read levels. The memory sub-system controller obtains a second of the CFBit count values associated with a second read level of the set of read levels. The memory sub-system controller computes a difference between the first and second CFBit count values and stores the difference as a first bin of the plurality of bins.

In some embodiments, the difference includes a first difference, and the memory sub-system controller obtains a third of the CFBit count values associated with a third read level of the set of read levels that is adjacent to the second read level. The memory sub-system controller computes a second difference between the second and third CFBit count values and stores the second difference as a second bin of the plurality of bins. In some aspects, the memory sub-system controller obtains a fourth of the CFBit count values associated with a fourth read level of the set of read levels that is adjacent to the third read level and computes a third difference between the third and fourth CFBit count values. The memory sub-system controller stores the third difference as a third bin of the plurality of bins.

In some examples, the memory sub-system controller determines whether a CFBit count condition is satisfied (also referred to as the bin criterion) based on comparing the first, second and third bins. The CFBit count condition can be satisfied in response to determining that the first bin is greater than the second bin and that the second bin is smaller than the third bin.

In some examples, the memory sub-system controller, in response to determining that the CFBit count condition is satisfied, determines whether the second bin is a local minimum. In response to determining that the second bin is not the local minimum, memory sub-system controller generates the CoV based on the second and third read levels. In some aspects, the operations for determining whether the second bin is the local minimum include: measuring the one or more error count values associated with data read based on read levels associated with the second bin; and comparing the one or more error count values to an error count threshold.

In some examples, the memory sub-system controller determines that the second bin is not the local minimum in response to determining that the one or more error count values fail to transgress the error count threshold. In some examples, the memory sub-system controller determines that the second bin is the local minimum in response to determining that the one or more error count values transgress the error count threshold. In some aspects, the one or more error count values correspond to a syndrome weight computed by accumulating parity check information stored in a syndrome vector. In some examples, the memory sub-system controller, in response to determining that the second bin is the local minimum, modifies read levels associated with one or more of the first, second and third bins.

In some examples, the memory sub-system controller obtains a predetermined CFBit value associated with the individual read level and determines whether the second CFBit count value exceeds the predetermined CFBit value. In some examples, the memory sub-system controller, in response to determining that the second CFBit count value exceeds the predetermined CFBit value, obtains a fifth of the CFBit count values associated with a fifth read level of the set of read levels that precedes the first read level. The memory sub-system controller computes a fourth difference between the fifth and first CFBit count values and updates the first bin based on the fourth difference. The memory sub-system controller updates the second bin based on the first difference between the first and second CFBit count values and updates the third bin based on the second difference between the second and third CFBit count values.

In some examples, the memory sub-system controller, in response to determining that the second CFBit count value is less than the predetermined CFBit value, obtains a fifth of the CFBit count values associated with a fifth read level of the set of read levels that follows to the fourth read level. The memory sub-system controller computes a fourth difference between the fifth and fourth CFBit count values and updates the third bin based on the fourth difference. The memory sub-system controller updates the second bin based on the third difference between the third and fourth CFBit count values and updates the first bin based on the second difference between the second and third CFBit count values.

In some aspects, the memory sub-system controller, in response to determining that the second bin is the local minimum, obtains a predetermined CFBit value associated with the individual read level and determines whether an average of second and third CFBit count values is within a threshold range of the predetermined CFBit value. The CoV can be generated based on the second and third read levels in response to determining that the average of the second and third CFBit count values is within the threshold range of the predetermined CFBit value.

Though various embodiments are described herein as being implemented with respect to a memory sub-system (e.g., a controller of the memory sub-system, a memory component, a media controller, or combination thereof), some or all of the portions of an embodiment can be implemented with respect to a host system, such as a software application, an operating system of the host system, or only by the media controller rather than or in addition to the memory sub-system controller.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120.

Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or LBAs that can refer to a unit of the memory component 112 used to store data. In some examples, the memory cells of the memory components 112A to 112N can be grouped into a set of different zones of equal or unequal size used to store data for corresponding applications. In such cases, each application can store data in an associated zone of the set of different zones.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other operations such as wear leveling operations, garbage collection operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

The memory sub-system 110 includes a read error correction module 122 that performs or facilitates correcting read data errors, such as by adjusting a CoV used to read data at an individual read level, in accordance with some embodiments described herein. In some embodiments, the controller 115 includes at least a portion of the read error correction module 122. For example, the controller 115 can include a processor 117 (processing device) configured to execute instructions stored in local memory 119 for performing the operations described herein. In some embodiments, the read error correction module 122 is part of the host system 120, such as a software application or an operating system on the host system 120. In some embodiments, the read error correction module 122 is part of the media controller 113A and/or media controller 113N.

According to some embodiments, the read error correction module 122 detects a read error associated with reading data from the set of memory components in accordance with an individual read level of a plurality of read levels. In response to detecting the read error, the read error correction module 122 generates a plurality of bins as a function of a plurality of CFBit count values and one or more error count values corresponding to a set of read levels adjacent to the individual read level. The read error correction module 122 computes a CoV for the individual read level based on a pair of read levels defined by a set of the plurality of bins and updates a read level used to read the data based on the computed CoV. The CFBit count, as referred to herein, represents a count of a total quantity of '1's that are stored or represented by an individual read level of the memory components 112A-N. The CFBit count can be cumulative such that read levels associated with higher read voltages have a higher CFBit count than read levels associated with lower read voltages. Namely, the memory components 112 can generate a total CFBit count and divide that total CFBit count by the total number of read levels that can be used to stored data in the memory components 112A. A first CFBit count can be obtained by reading a quantity of '1's (or alternatively '0's) stored at a first read level and a second CFBit count can be obtained by reading a quantity of '1's (or alternatively '0's) stored at a second read level (which can be adjacent to the first read level). The second read level can be associated with a higher voltage than the first read level and, as a result, the CFBit count of the second read level includes the first CFBit count (e.g., the CFBit count of the first read level) and the CFBit count of the second read level. These CFBit counts can be used to determine a CoV and identify, based on the CoV, a read level for reading data from a given level of the memory components 112.

In some aspects, the read error correction module 122 obtains a first of the CFBit count values associated with a first read level of the set of read levels. The memory sub-system controller obtains a second of the CFBit count values associated with a second read level of the set of read levels. The read error correction module 122 computes a difference between the first and second CFBit count values and stores the difference as a first bin of the plurality of bins.

In some embodiments, the difference including a first difference, and the read error correction module 122 obtains a third of the CFBit count values associated with a third read level of the set of read levels that is adjacent to the second read level. The read error correction module 122 computes a second difference between the second and third CFBit count values and stores the second difference as a second bin of the plurality of bins. In some aspects, the read error correction module 122 obtains a fourth of the CFBit count values associated with a fourth read level of the set of read levels that is adjacent to the third read level and computes a third difference between the third and fourth CFBit count values. The read error correction module 122 stores the third difference as a third bin of the plurality of bins.

In some examples, the read error correction module 122 determines whether a CFBit count condition is satisfied (also referred to as the bin criterion) based on comparing the first, second and third bins. The CFBit count condition can be satisfied in response to determining that the first bin is greater than the second bin and that the second bin is smaller than the third bin.

In some examples, the read error correction module 122, in response to determining that the CFBit count condition is satisfied, determines whether the second bin is a local minimum. In response to determining that the second bin is not the local minimum, read error correction module 122 generates the CoV based on the second and third read levels. In some aspects, the operations for determining whether the second bin is the local minimum include: measuring the one or more error count values associated with data read based on read levels associated with the second bin; and comparing the one or more error count values to an error count threshold.

In some examples, the read error correction module 122 determines that the second bin is not the local minimum in response to determining that the one or more error count values fail to transgress the error count threshold. In some examples, the read error correction module 122 determines that the second bin is the local minimum in response to determining that the one or more error count values transgress the error count threshold. In some aspects, the one or more error count values correspond to a syndrome weight computed by accumulating parity check information stored in a syndrome vector. In some examples, the read error correction module 122, in response to determining that the second bin is the local minimum, modifies read levels associated with one or more of the first, second and third bins.

In some examples, the read error correction module 122 obtains a predetermined CFBit value associated with the individual read level and determines whether the second CFBit count value exceeds the predetermined CFBit value. In some examples, the read error correction module 122, in response to determining that the second CFBit count value exceeds the predetermined CFBit value, obtains a fifth CFBit count value of the CFBit count values associated with a fifth read level of the set of read levels that precedes to the first read level. The read error correction module 122 computes a fourth difference between the fifth and first CFBit count values and updates the first bin based on the fourth difference. The read error correction module 122 updates the second bin based on the first difference between the first and second CFBit count values and updates the third bin based on the second difference between the second and third CFBit count values.

In some examples, the read error correction module 122, in response to determining that the second CFBit count value is less than the predetermined CFBit value, obtains a fifth of the CFBit count values associated with a fifth read level of the set of read levels that follows the fourth read level. The read error correction module 122 computes a fourth difference between the fifth and fourth CFBit count values and updates the third bin based on the fourth difference. The read error correction module 122 updates the second bin based on the third difference between the third and fourth CFBit count values and updates the first bin based on the second difference between the second and third CFBit count values.

In some aspects, the read error correction module 122, in response to determining that the second bin is the local minimum, obtains a predetermined CFBit value associated with the individual read level and determines whether an average of second and third CFBit count values is within a threshold range of the predetermined CFBit value. The CoV can be generated based on the second and third read levels in response to determining that the average of the second and third CFBit count values is within the threshold range of the predetermined CFBit value.

Depending on the embodiment, the read error correction module 122 can comprise logic (e.g., a set of transitory or non-transitory machine instructions, such as firmware) or one or more components that causes the memory sub-system 110 (e.g., the memory sub-system controller 115) to perform operations described herein with respect to the read error correction module 122. The read error correction module 122 can comprise a tangible or non-tangible unit capable of performing operations described herein. Further details with regards to the operations of the read error correction module 122 are described below.

Figure 2:
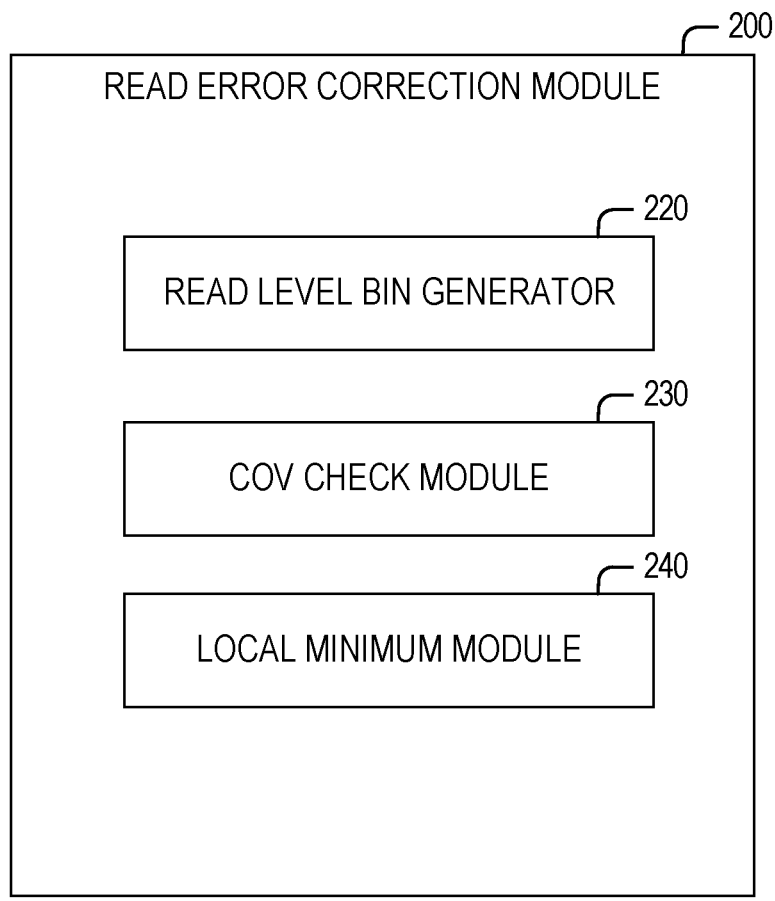
FIG. 2 is a block diagram of an example read error correction module, in accordance with some implementations of the present disclosure.

FIG. 2 is a block diagram of an example read error correction module 200, in accordance with some implementations of the present disclosure. As illustrated, the read error correction module 200 includes a read level bin generator 220, a COV check module 230, and a local minimum module 240. For some embodiments, the read error correction module 200 can differ in components or arrangement (e.g., less or more components) from what is illustrated in FIG. 2. The read error correction module 200 can be implemented by the memory sub-system controller 115 and/or by one or more of the media controllers 113A-N.

The read error correction module 200 can be used in case of encountering a read error associated with reading data from the memory components 112 according to an individual read level of a plurality of read levels. In such cases, the read level bin generator 220 generates a plurality of bins that represent differences in CFBit count values of different adjacent read levels. Specifically, the read level bin generator 220 can generate the bins by reading data from the memory components 112 according to at least four read levels that are adjacent and sequential. As mentioned before, the CFBit represents the total number of '1's or '0's stored at an individual read level.

Figure 3:
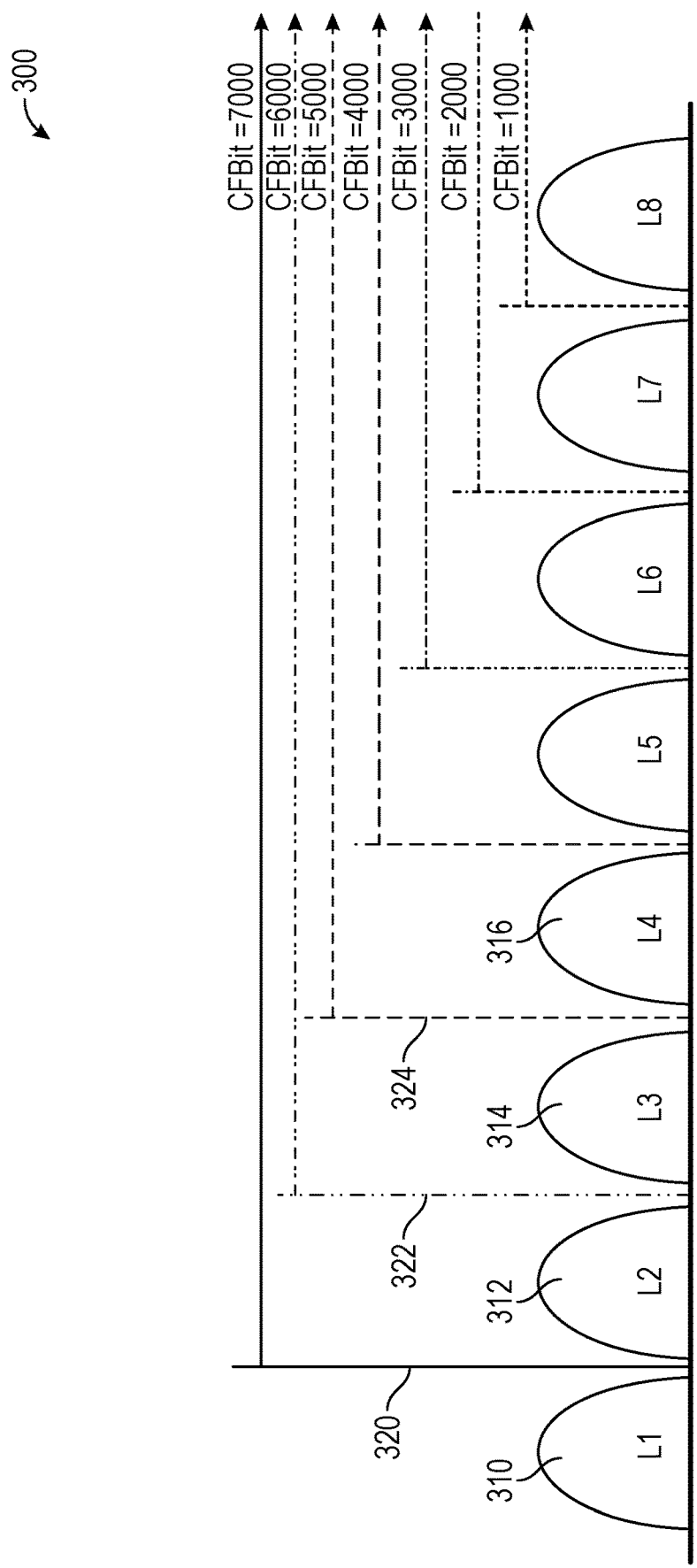
FIG. 3 presents a list of different read levels and check failure bits (CFBits) of the associated CoVs, in accordance with some implementations of the present disclosure.

For example, as in the distribution of CFBits 300 shown in FIG. 3, the memory components 112 can store data in one of eight different levels (L1-L8). Each of the different levels can be read by applying a different read threshold voltage (read level). For example, data stored in a first level 310 can be read by applying a first range of read levels, data stored in a second level 312 can be read by applying a second range of read levels, data stored in a third level 314 can be read by applying a fourth range of read levels, and data stored in a fourth level 316 can be read by applying a fifth range of read levels. Ideally, the read level that is applied to optimally and most effectively read data from a particular level is defined by a CoV, such as a first CoV 320, a second CoV 322, and a third CoV 324.

In order to improve the accuracy of determining the correct CoV for each read level (which defines an appropriate range of read levels for accurately reading data from a given level), the memory components 112 store or can generate ideal or predetermined CFBit count values for each level. For example, the first CoV 320 can be associated with a first CFBit count (e.g., 7000), the second CoV 322 can be associated with a second CFBit count (e.g., 6000), and the third CoV 324 can be associated with a third CFBit count (e.g., 5000). It can be seen that the CFBit counts differ by a predetermined quantity between each corresponding CoV that is read. Using this information, the read level bin generator 220 can determine and identify the most accurate bin that defines a range of read levels that can be applied to read data from a given one of the levels (e.g., the first level 310, the second level 312, the third level 314, and the fourth level 316).

Figure 4A:
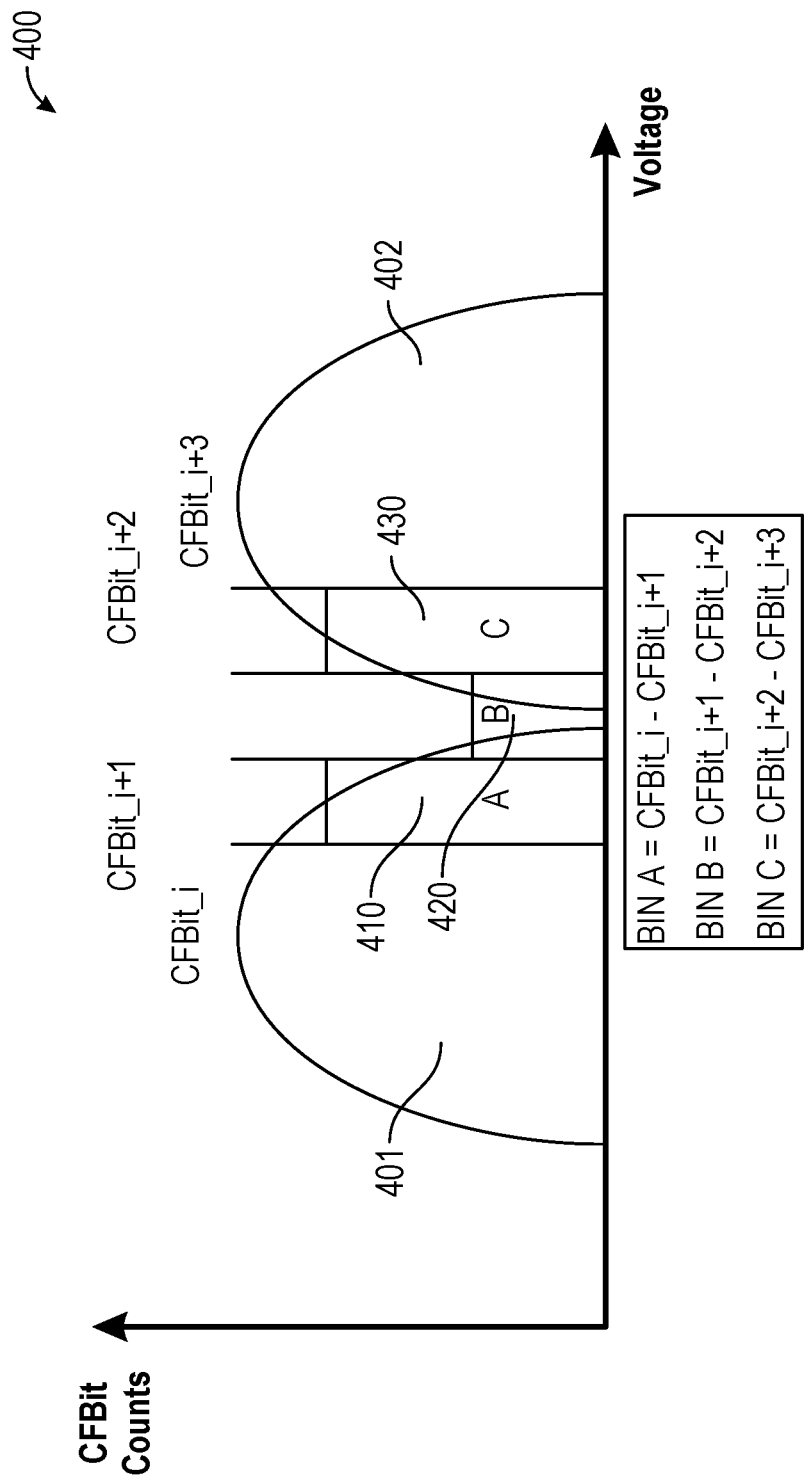
FIGS. 4A and 4B present a list of bins generated using the CFBits of two adjacent read levels, in accordance with some implementations of the present disclosure.

In some examples, to identify the CoV (e.g., the second CoV 322) the read level bin generator 220 generates three bins, as shown in the set of bins 400 of FIG. 4A. The set of bins 400 can be used to identify a CoV between a first level 401 and a second level 402. The first level 401 can correspond to a first one of the levels shown in FIG. 3 (e.g., the second level 312) and the second level 402 can correspond to a second one of the levels shown in FIG. 3 (e.g., the third level 314) that is adjacent to the first one of the levels.

The read level bin generator 220 can obtain a first CFBit count value (e.g., CFBit_i) associated with a first read level (which can correspond to the individual read level that resulted in the errors detected by the memory sub-system controller 115). The read level bin generator 220 can obtain a second CFBit count value (e.g., CFBit_i+1) associated with a second read level which is offset from the first read level by a first threshold voltage amount. The read level bin generator 220 can obtain a third CFBit count value (e.g., CFBit_i+2) associated with a third read level and can obtain a fourth CFBit count value (e.g., CFBit_i+3) associated with a fourth read level. The third read level can be offset from the second read level by the first threshold voltage amount (or some other threshold) and the fourth read level can be offset from the third read level by the first threshold voltage amount (or some other threshold).

After computing or obtaining the four different CFBit count values, the read level bin generator 220 can generate the three bins 410, 420, and 430. To generate the first bin 410, the read level bin generator 220 computes a difference between the first and second CFBit count values (e.g., BIN A=CFBit_i−CFBit_i+1). To generate the second bin 420, the read level bin generator 220 computes a difference between the second and third CFBit count values (e.g., BIN B=CFBit_i+1−CFBit_i+2). To generate the third bin 430, the read level bin generator 220 computes a difference between the third and fourth CFBit count values (e.g., BIN C=CFBit_i+2−CFBit_i+3).

In some examples, the read level bin generator 220 provides the generated bins to the COV check module 230 to determine whether the differences stored in each of the bins relatively or in combination satisfy a bin criterion. The bin criterion can include a condition that a middle bin (e.g., second bin 420) stores a smaller value than the first bin 410 and the third bin 430 (e.g., that BIN A>BIN B<BIN C). If the differences stored in each of the bins relatively or in combination satisfy the bin criterion, the COV check module 230 determines that the middle bin, such as the second bin 420, represents a range of read levels that define the CoV between the first level 401 and the second level 402. Otherwise, the COV check module 230 selects a new set of read levels to find a read level that is used to generate bins that do satisfy the bin criterion to determine the correct read level.

Figure 4B:
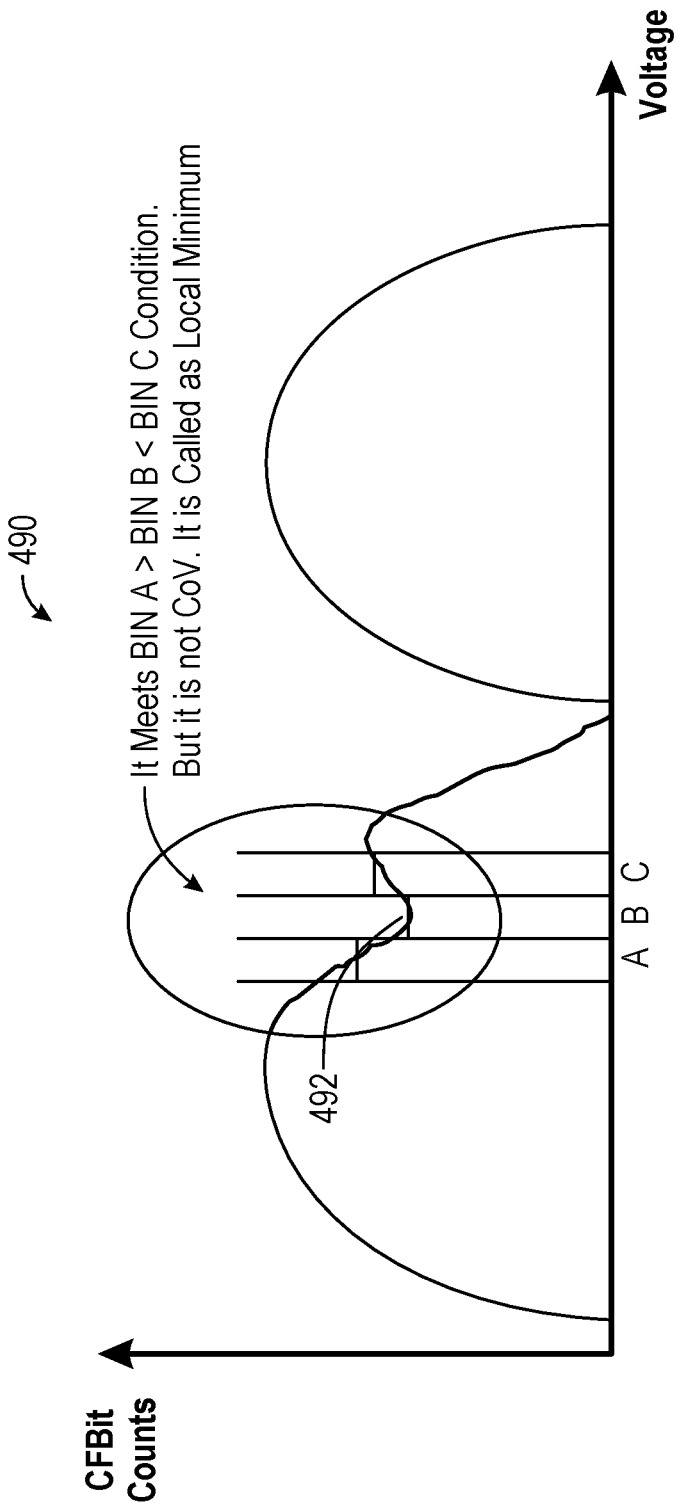

In some cases, the bin criterion can be determined to be satisfied even though the second bin does not correspond to the CoV. This can be the result of performing read levels in a region corresponding to a local minimum of the CFBit counts of a given level. For example, as shown in the set of bins 490 FIG. 4B, the bin condition is satisfied by the three bins (e.g., BIN A>BIN B<BIN C) but the CoV 492 actually falls entirely within the region of the first level 401 and not between the first level 401 and the second level 402 as would ideally be the case. In some examples, to verify whether the three bins incorrectly define the CoV, such as if they correspond to a local minimum, the COV check module 230 instructs the local minimum module 240 to determine whether a local minimum corresponds to the generated bins.

The local minimum module 240 is configured to read data from a region defined by each of the different bins. For example, the local minimum module 240 reads a first set of data using a read level that falls between the read levels that were used to define or generate the first bin 410. The local minimum module 240 reads a second set of data using a read level that falls between the read levels that were used to define or generate the second bin 420. The local minimum module 240 reads a third set of data using a read level that falls between the read levels that were used to define or generate the third bin 430. The local minimum module 240 can compute a respective set of error values or parity information for each of the first, second and third data sets.

In some examples, the local minimum module 240 applies an LDPC decoding process on each of the first, second and third data sets to generate a syndrome weight that represents a number of parity check nodes for each data set. For example, the syndrome weight with a lower value represents a lower quantity of errors than a syndrome weight with a higher value. The syndrome weight of 0 can mean that there exist no bit errors in the code word generated by the corresponding data set. If there exist bit errors in the data set, the LDPC decoder can be used to decode the codeword to reduce the syndrome weight. In some examples, the local minimum module 240 computes a first syndrome vector based on applying an LDPC iteration on the first set of data. Based on counting the quantity of '1's in the first syndrome vector, the local minimum module 240 determines the syndrome weight for the first set of data. Similarly, the local minimum module 240 determines the syndrome weight for the second and third sets of data. The local minimum module 240 can determine whether the second set of data is associated with a lower syndrome weight than the first and third sets of data corresponding to the first and third bins. Namely, the local minimum module 240 determines whether data read using a read level defined by the second bin 420 includes less errors than data read using the adjacent first and third bins 410 and 430, respectively or that the data read using a read level defined by the second bin 420 includes less errors than a threshold (e.g., the syndrome weight of the first set of data fails to transgress a syndrome threshold value). If so, the local minimum module 240 determines that the three bins do not correspond to a local minimum. In such cases, the read error correction module 200 computes the CoV for the individual read level based on the range of read levels defined by the second bin 420.

In response to determining that the second set of data is not associated with a lower syndrome weight than the first and third sets of data corresponding to the first and third bins (e.g., the second set of data includes more errors than either the first or third sets of data), the local minimum module 240 determines that the three bins generated by the read level bin generator 220 correspond to a local minimum. For example, the local minimum module 240 determines that the syndrome weight computed for the second set of data transgresses the syndrome threshold value. In such cases, the read error correction module 200 adjusts the individual read level to define a new set of bins.

To adjust the read level, the read error correction module 200 obtains an ideal CFBit count value for the individual read level. The read error correction module 200 can obtain the CFBit count value associated with the second read level that defines a first boundary of the second bin 420. The read error correction module 200 determines if the CFBit count value associated with the second read level is less than the ideal CFBit count value for the individual read level. If so, the read error correction module 200 determines that the second bin 420 is closer to a level associated with a higher read level. For example, the CoV defined by the second bin 420 (corresponding to a read level for the second CoV 322) is positioned too close to the second level 312 and needs to be shifted closer to the third level 314. In this case, the read error correction module 200 rebuilds the three bins by obtaining a CFBit count value for a read level that is lower than the first read level used to generate the first bin 410 of the three bins initially by a threshold amount (e.g., CFBit_i−1). The read error correction module 200 then recomputes BIN A by the difference between CFBit_i−1 and CFBit_i; recomputes BIN B by the difference between CFBit_i and CFBit_i+1; and recomputes BIN C by the difference between CFBit_i+1 and CFBit_i+2.

Alternatively, the CFBit count value associated with the second read level can be determined to be greater than the ideal CFBit count value for the individual read level. If so, the read error correction module 200 determines that the second bin 420 is closer to a level associated with a lower read level. For example, the CoV defined by the second bin 420 (corresponding to a read level for the second CoV 322) is positioned too close to the third level 314 and needs to be shifted closer to the second level 312. In this case, the read error correction module 200 rebuilds the three bins by obtaining a CFBit count value for a read level that is higher than the fourth read level used to generate the third bin 430 of the three bins initially by a threshold amount (e.g., CFBit_i+1). The read error correction module 200 then recomputes BIN A by the difference between CFBit_i+1 and CFBit_i+2; recomputes BIN B by the difference between CFBit_i+2 and CFBit_i+3; and recomputes BIN C by the difference between CFBit_i1+3 and CFBit_i+4.

Figure 5:
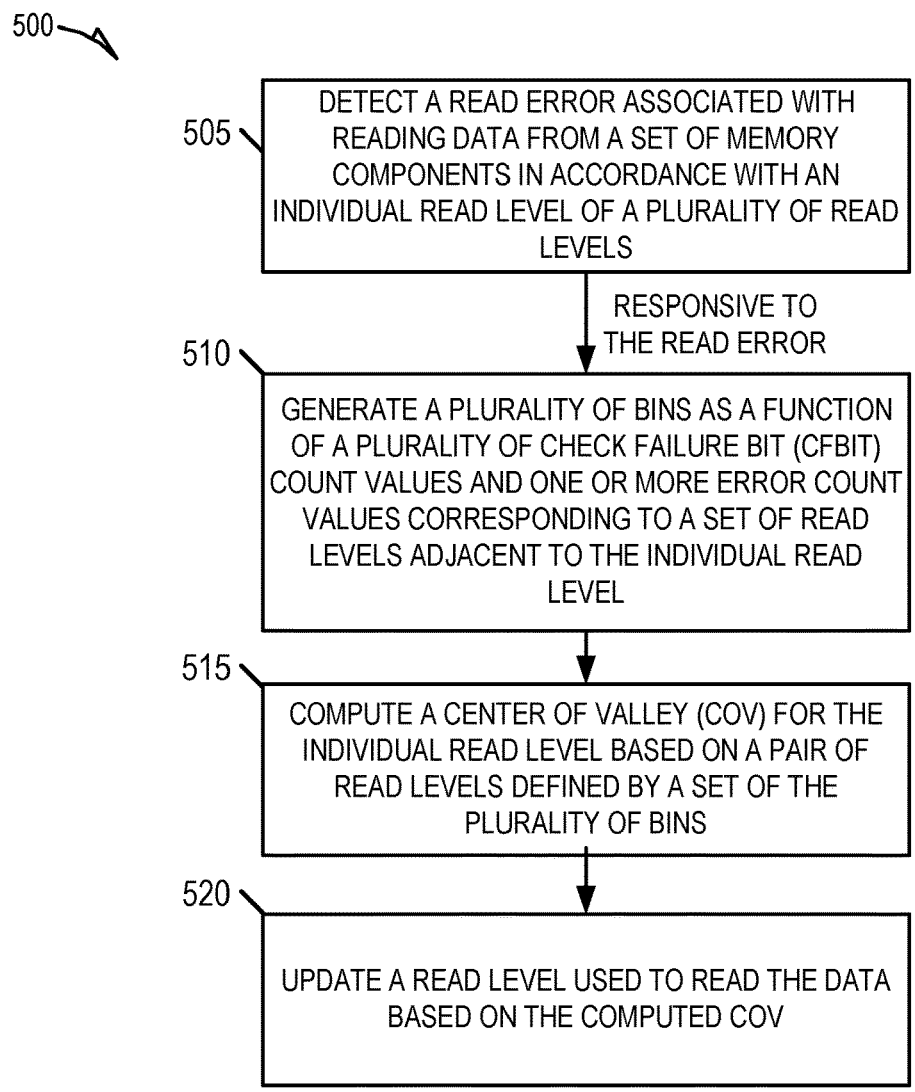
FIGS. 5 and 6 are flow diagrams of example methods to perform read error correction, in accordance with some implementations of the present disclosure.

FIG. 5 is a flow diagram of an example method 500 to perform read error correction, in accordance with some implementations of the present disclosure. Method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the memory sub-system controller 115 of FIG. 1. In these embodiments, the method 500 can be performed, at least in part, by the read error correction module 122. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 5, the method (or process) 500 begins at operation 505, with a processing device of a memory sub-system (e.g., of processor of the memory sub-system controller 115) detecting a read error associated with reading data from a set of memory components in accordance with an individual read level of a plurality of read levels.

At operation 510, the processing device of the memory sub-system, in response to receiving the read error at operation 505, generates a plurality of bins as a function of a plurality of CFBit count values and one or more error count values corresponding to a set of read levels adjacent to the individual read level.

The processing device of the memory sub-system, at operation 515, computes a CoV for the individual read level based on a pair of the read levels defined by a set of the plurality of bins. Then, the processing device of the memory sub-system, at operation 520, updates a read level used to read the data based on the computed CoV.

Figure 6:
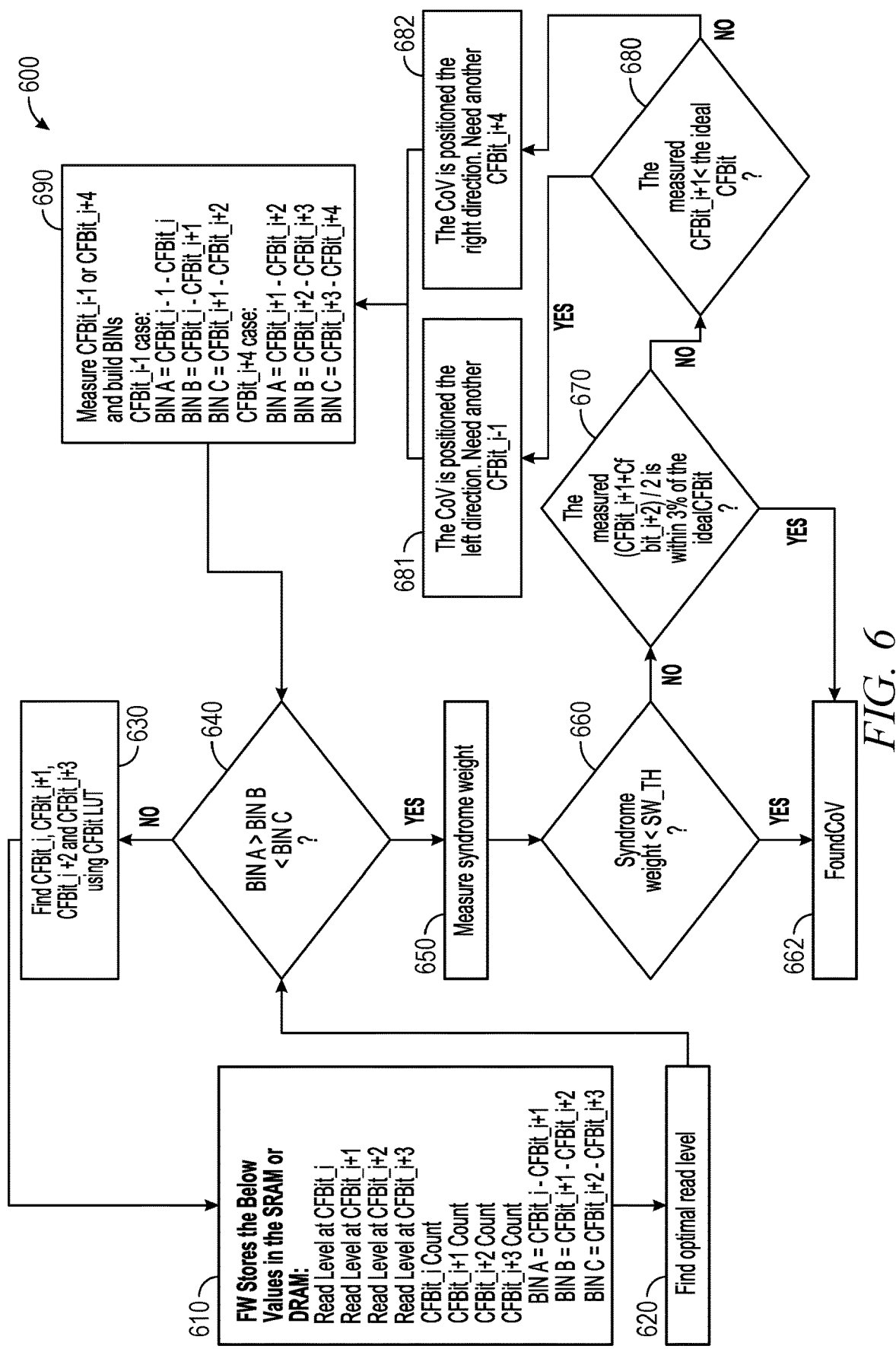

FIG. 6 is a flow diagram of an example method 600 to perform read error correction, in accordance with some implementations of the present disclosure. Method 600 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 600 is performed by the memory sub-system controller 115 of FIG. 1. In these embodiments, the method 600 can be performed, at least in part, by the read error correction module 122. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 6, the method (or process) 600 begins at operation 610, with a processing device of a memory sub-system (e.g., of processor of the memory sub-system controller 115) storing an individual read level used to read data from the memory sub-system that stores data using a plurality of read levels. The processing device also selects and generates a plurality of adjacent read levels that are offset from the individual read level by predetermined offset voltage values. The operation 610 also includes the generation of a set of bins (e.g., BIN A, BIN B, BIN C) based on CFBit count values (e.g., CFBit_i, CFBit_i+1, CFBit_i+2, and CFBit_i+3) obtained by accessing the bit lines of the memory components using the plurality of adjacent read levels. For example, the processing device computes BIN A based on a difference between CFBit_i and CFBit_i+1; BIN B based on a difference between CFBit_i+1 and CFBit_i+2; and BIN C based on a difference between CFBit_i+2 and CFBit_i+3.

At operation 620, the processing device of the memory sub-system finds an optimal read level, such as by determining a range of read levels defined by the boundaries of BIN B (the second bin between and adjacent to the first and third bins).

The processing device of the memory sub-system, at operation 640, determines whether the plurality of bins satisfy a bin criterion (e.g., the BIN A>BIN B<BIN C). Then, if the bin criterion is satisfied, the processing device computes, at operation 650, a syndrome weight associated with read data using respective read levels associated with each of the three bins. This process is performed if the bin criterion is satisfied. If it is determined at operation 640 that the bin criterion is not satisfied, the processing device of the memory sub-system performs operation 630 to find another set of read levels using a look-up table for the level of the memory component from which data is being read.

At operation 660, the processing device of the memory sub-system determines if the syndrome weight of the read level selected based on the second bin satisfies a syndrome threshold (e.g., whether the syndrome weight is less than the syndrome threshold) to determine whether the bins correspond to a local minimum. If the bins do not correspond to the local minimum, the processing device of the memory sub-system determines the CoV at operation 662 based on the boundaries of the second bin 420. If the bins correspond to the local minimum, the processing device of the memory sub-system performs operation 670 to determine whether an average of the boundaries of the second bin (e.g., the CFBit count values that were used to store the difference in the second bin) is within a threshold range of a predetermined CFBit count value of the individual read level. For example, the processing device of the memory sub-system computes (CFBit_i+1+CFBit_i+2)/2 and compares this to a percentage of the predetermined or ideal CFBit count value of the individual read level.

If the average is within the percentage of the predetermined or ideal CFBit count value of the individual read level, the processing device of the memory sub-system performs operation 662. Otherwise, the processing device of the memory sub-system performs operation 680 to determine which direction to shift the plurality of bins based on the predetermined count value. Specifically, at operation 680, the processing device of the memory sub-system obtains an ideal CFBit count value for the individual read level. The processing device of the memory sub-system can obtain the CFBit count value associated with the second read level that defines a first boundary of the second bin 420. Then, at operation 680, the processing device of the memory sub-system determines if the CFBit count value associated with the second read level is less than the ideal CFBit count value for the individual read level. If so, the processing device of the memory sub-system determines that the second bin 420 is closer to a level associated with a higher read level at operation 681. For example, the CoV defined by the second bin 420 (corresponding to a read level for the second CoV 322) is positioned too close to the second level 312 and needs to be shifted closer to the third level 314. In this case, the processing device of the memory sub-system rebuilds the three bins at operation 690 by obtaining a CFBit count value for a read level that is lower than the first read level used to generate the first bin 410 of the three bins initially by a threshold amount (e.g., CFBit_i−1). The processing device of the memory sub-system then recomputes BIN A by the difference between CFBit_i−1 and CFBit_i; recomputes BIN B by the difference between CFBit_i and CFBit_i+1; and recomputes BIN C by the difference between CFBit_i+1 and CFBit_i+2.

Alternatively, the CFBit count value associated with the second read level can be determined to be greater than the ideal CFBit count value for the individual read level. If so, the processing device of the memory sub-system determines that the second bin 420 is closer to a level associated with a lower read level at operation 682. For example, the CoV defined by the second bin 420 (corresponding to a read level for the second CoV 322) is positioned too close to the third level 314 and needs to be shifted closer to the second level 312. In this case, the processing device of the memory sub-system at operation 690 rebuilds the three bins by obtaining a CFBit count value for a read level that is higher than the fourth read level used to generate the third bin 430 of the three bins initially by a threshold amount (e.g., CFBit_i+1). The processing device of the memory sub-system then recomputes BIN A by the difference between CFBit_i+1 and CFBit_i+2; recomputes BIN B by the difference between CFBit_i+2 and CFBit_i+3; and recomputes BIN C by the difference between CFBit_i1+3 and CFBit_i+4.

In view of the disclosure above, various examples are set forth below. It should be noted that one or more features of an example, taken in isolation or combination, should be considered within the disclosure of this application.

Example 1. A system comprising: a set of memory components; and a processing device, operatively coupled to the set of memory components, configured to perform operations comprising: detecting a read error associated with reading data from the set of memory components in accordance with an individual read level of a plurality of read levels; and in response to detecting the read error: generating a plurality of bins as a function of a plurality of check failure bit (CFBit) count values and one or more error count values corresponding to a set of read levels adjacent to the individual read level; computing a center of valley (CoV) for the individual read level based on a pair of read levels defined by a set of the plurality of bins; and updating a read level used to read the data based on the computed CoV.

Example 2. The system of Example 1, the operations comprising: obtaining a first of the CFBit count values associated with a first read level of the set of read levels; obtaining a second of the CFBit count values associated with a second read level of the set of read levels; computing a difference between the first and second CFBit count values; and storing the difference as a first bin of the plurality of bins.

Example 3. The system of Example 2, the difference comprising a first difference, the operations comprising: obtaining a third of the CFBit count values associated with a third read level of the set of read levels that is adjacent to the second read level; computing a second difference between the second and third CFBit count values; and storing the second difference as a second bin of the plurality of bins.

Example 4. The system of Example 3, the operations comprising: obtaining a fourth of the CFBit count values associated with a fourth read level of the set of read levels that is adjacent to the third read level; computing a third difference between the third and fourth CFBit count values; and storing the third difference as a third bin of the plurality of bins.

Example 5. The system of Example 4, the operations comprising: determining whether a CFBit count condition is satisfied based on comparing the first, second and third bins.

Example 6. The system of Example 5, wherein the CFBit count condition is satisfied in response to determining that the first bin is greater than the second bin and that the second bin is smaller than the third bin.

Example 7. The system of Examples 5 or 6, the operations comprising: in response to determining that the CFBit count condition is satisfied, determining whether the second bin is a local minimum.

Example 8. The system of Example 7, the operations comprising: in response to determining that the second bin is not the local minimum, generating the CoV based on the second and third read levels.

Example 9. The system of Examples 7 or 8, the operations for determining whether the second bin is the local minimum comprising: measuring the one or more error count values associated with data read based on read levels associated with the second bin; and comparing the one or more error count values to an error count threshold.

Example 10. The system of Example 9, the operations comprising: determining that the second bin is not the local minimum in response to determining that the one or more error count values fail to transgress the error count threshold.

Example 11. The system of Examples 1-10, the operations comprising: determining that the second bin is the local minimum in response to determining that the one or more error count values transgress the error count threshold.

Example 12. The system of Examples 1-11, wherein the one or more error count values correspond to a syndrome weight computed by accumulating parity check information stored in a syndrome vector.

Example 13. The system of Examples 1-12, the operations comprising: in response to determining that the second bin is the local minimum, modifying read levels associated with one or more of the first, second and third bins.

Example 14. The system of Example 13, the operations comprising: obtaining a predetermined CFBit value associated with the individual read level; and determining whether the second CFBit count value exceeds the predetermined CFBit value.

Example 15. The system of Example 14, the operations comprising: in response to determining that the second CFBit count value exceeds the predetermined CFBit value: obtaining a fifth of the CFBit count values associated with a fifth read level of the set of read levels that precedes the first read level; computing a fourth difference between the fifth and first CFBit count values; updating the first bin based on the fourth difference; updating the second bin based on the first difference between the first and second CFBit count values; and updating the third bin based on the second difference between the second and third CFBit count values.

Example 16. The system of Examples 14 or 15, the operations comprising: in response to determining that the second CFBit count value is less than the predetermined CFBit value: obtaining a fifth of the CFBit count values associated with a fifth read level of the set of read levels that follows the fourth read level; computing a fourth difference between the fifth and fourth CFBit count values; updating the third bin based on the fourth difference; updating the second bin based on the third difference between the third and fourth CFBit count values; and updating the first bin based on the second difference between the second and third CFBit count values.

Example 17. The system of Examples 1-16, the operations comprising: in response to determining that the second bin is the local minimum: obtaining a predetermined CFBit value associated with the individual read level; and determining whether an average of the second and third CFBit count values is within a threshold range of the predetermined CFBit value, wherein the CoV is generated based on the second and third read levels in response to determining that the average of the second and third CFBit count values is within the threshold range of the predetermined CFBit value.

Methods and computer-readable storage medium with instructions for performing any one of the above Examples.

Figure 7:
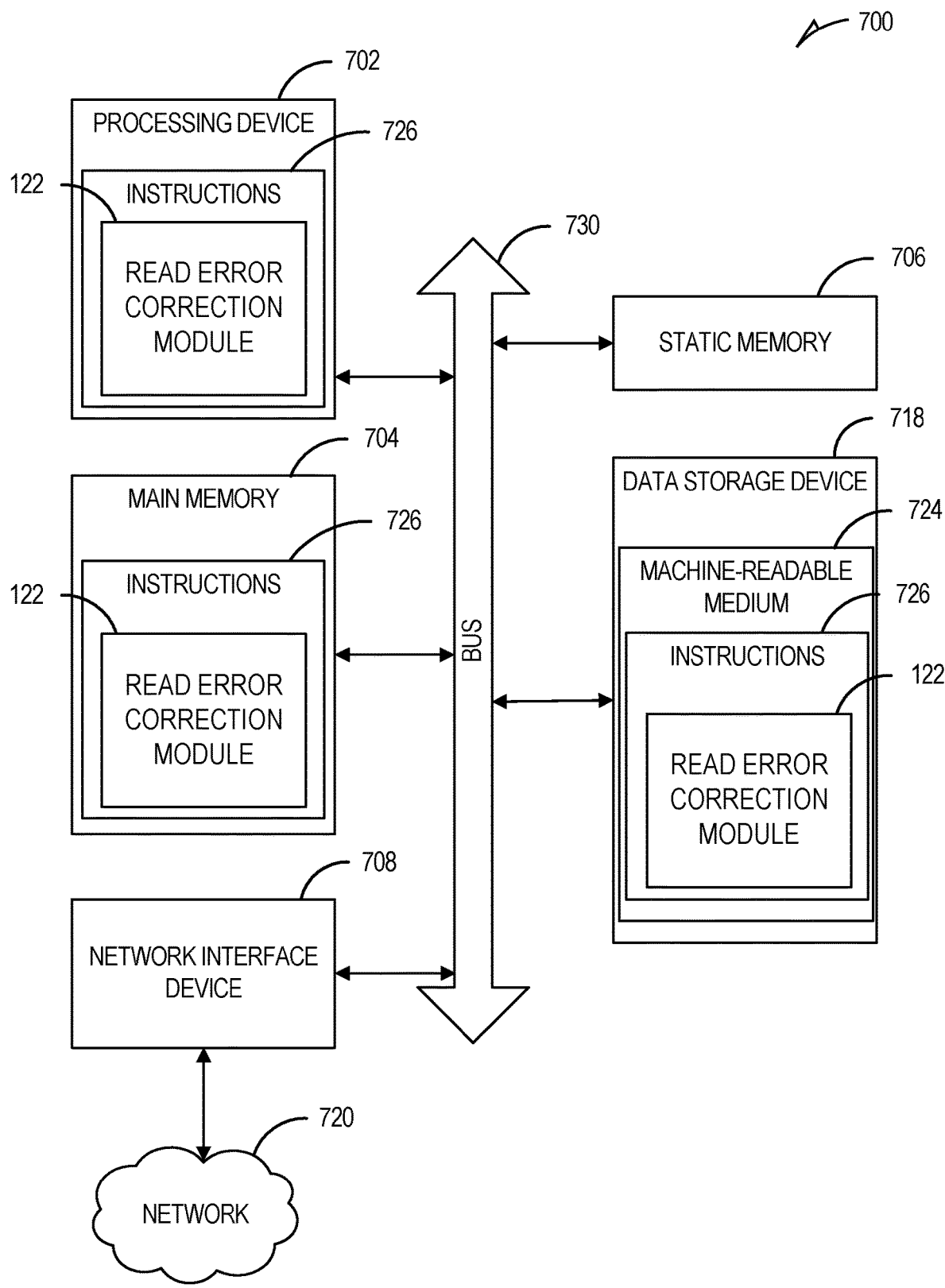
FIG. 7 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read error correction module 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to zone-based decoding (e.g., the read error correction module 122 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
a set of memory components; and
a processing device, operatively coupled to the set of memory components, configured to perform operations comprising:
detecting a read error associated with reading data from the set of memory components in accordance with an individual read level of a plurality of read levels; and
in response to detecting the read error:
generating a plurality of bins as a function of a plurality of check failure bit (CFBit) count values corresponding to a set of read levels adjacent to the individual read level;
adjusting the plurality of bins based on one or more error count values computed by reading data from the set of memory components using the plurality of bins;
computing a center of valley (CoV) for the individual read level based on a pair of read levels defined by a set of the plurality of bins; and
updating a read level used to read the data from the set of memory components based on the computed CoV.

2. The system of claim 1, the operations further comprising:
obtaining a first of the CFBit count values associated with a first read level of the set of read levels;
obtaining a second of the CFBit count values associated with a second read level of the set of read levels;
computing a difference between the first and second CFBit count values; and
storing the difference as a first bin of the plurality of bins.

3. The system of claim 2, the difference comprising a first difference, the operations further comprising:
obtaining a third of the CFBit count values associated with a third read level of the set of read levels that is adjacent to the second read level;

computing a second difference between the second and third CFBit count values; and storing the second difference as a second bin of the plurality of bins.

4. The system of claim 3, the operations further comprising:

obtaining a fourth of the CFBit count values associated with a fourth read level of the set of read levels that is adjacent to the third read level;

computing a third difference between the third and fourth CFBit count values; and storing the third difference as a third bin of the plurality of bins.

5. The system of claim 4, the operations further comprising:

determining whether a CFBit count condition is satisfied based on comparing the first, second and third bins.

6. The system of claim 5, wherein the CFBit count condition is satisfied in response to determining that the first bin is greater than the second bin and that the second bin is smaller than the third bin.

7. The system of claim 5, the operations further comprising:

in response to determining that the CFBit count condition is satisfied, determining whether the second bin is a local minimum.

8. The system of claim 7, the operations further comprising:

in response to determining that the second bin is not the local minimum, generating the CoV based on the second and third read levels.

9. The system of claim 7, the operations for determining whether the second bin is the local minimum comprising:

measuring the one or more error count values associated with data read based on read levels associated with the second bin; and comparing the one or more error count values to an error count threshold.

10. The system of claim 9, the operations further comprising:

determining that the second bin is not the local minimum in response to determining that the one or more error count values fail to transgress the error count threshold.

11. The system of claim 9, the operations further comprising:

determining that the second bin is the local minimum in response to determining that the one or more error count values transgress the error count threshold.

12. The system of claim 9, wherein the one or more error count values correspond to a syndrome weight computed by accumulating parity check information stored in a syndrome vector.

13. The system of claim 7, the operations further comprising:

in response to determining that the second bin is the local minimum, modifying read levels associated with one or more of the first, second and third bins.

14. The system of claim 13, the operations further comprising:

obtaining a predetermined CFBit value associated with the individual read level; and determining whether the second CFBit count value exceeds the predetermined CFBit value.

15. The system of claim 14, the operations further comprising:

in response to determining that the second CFBit count value exceeds the predetermined CFBit value:

obtaining a fifth of the CFBit count values associated with a fifth read level of the set of read levels that precedes the first read level;

computing a fourth difference between the fifth and first CFBit count values;

updating the first bin based on the fourth difference;

updating the second bin based on the first difference between the first and second CFBit count values; and updating the third bin based on the second difference between the second and third CFBit count values.

16. The system of claim 14, the operations further comprising:

in response to determining that the second CFBit count value is less than the predetermined CFBit value:

obtaining a fifth of the CFBit count values associated with a fifth read level of the set of read levels that follows the fourth read level;

computing a fourth difference between the fifth and fourth CFBit count values;

updating the third bin based on the fourth difference;

updating the second bin based on the third difference between the third and fourth CFBit count values; and updating the first bin based on the second difference between the second and third CFBit count values.

17. The system of claim 13, the operations further comprising:

in response to determining that the second bin is the local minimum:

obtaining a predetermined CFBit value associated with the individual read level; and determining whether an average of the second and third CFBit count values is within a threshold range of the predetermined CFBit value, wherein the CoV is generated based on the second and third read levels in response to determining that the average of the second and third CFBit count values is within the threshold range of the predetermined CFBit value.

18. A method comprising:

detecting a read error associated with reading data from a set of memory components in accordance with an individual read level of a plurality of read levels; and in response to detecting the read error:

generating a plurality of bins as a function of a plurality of check failure bit (CFBit) count values corresponding to a set of read levels adjacent to the individual read level;

adjusting the plurality of bins based on one or more error count values computed by reading data from the set of memory components using the plurality of bins;

computing a center of valley (CoV) for the individual read level based on a pair of read levels defined by a set of the plurality of bins; and updating a read level used to read the data from the set of memory components based on the computed CoV.

19. The method of claim 18, further comprising:

obtaining a first of the CFBit count values associated with a first read level of the set of read levels;

obtaining a second of the CFBit count values associated with a second read level of the set of read levels;

computing a difference between the first and second CFBit count values; and storing the difference as a first bin of the plurality of bins.

20. A non-transitory computer-readable storage medium comprising instructions that, when executed by a processing device, cause the processing device to perform operations comprising:

detecting a read error associated with reading data from a set of memory components in accordance with an individual read level of a plurality of read levels; and in response to detecting the read error:

generating a plurality of bins as a function of a plurality of check failure bit (CFBit) count values corresponding to a set of read levels adjacent to the individual read level;

adjusting the plurality of bins based on one or more error count values computed by reading data from the set of memory components using the plurality of bins;

computing a center of valley (CoV) for the individual read level based on a pair of read levels defined by a set of the plurality of bins; and updating a read level used to read the data from the set of memory components based on the computed CoV.

\* \* \* \* \*